(12) United States Patent
Yamauchi et al.

(10) Patent No.: US 10,199,268 B2
(45) Date of Patent: Feb. 5, 2019

(54) FILM FORMING METHOD AND FILM FORMING SYSTEM

(71) Applicant: TOKYO ELECTRON LIMITED, Tokyo (JP)

(72) Inventors: Susumu Yamauchi, Yamanashi (JP); Jun Lin, Yamanashi (JP); Kazuaki Nishimura, Yamanashi (JP); Toshio Hasegawa, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/698,498

(22) Filed: Sep. 7, 2017

(65) Prior Publication Data

US 2018/0076087 A1    Mar. 15, 2018

(30) Foreign Application Priority Data

Sep. 9, 2016 (JP) .................................. 2016-176421

(51) Int. Cl.
| | |
|---|---|
| *H01L 21/44* | (2006.01) |
| *H01L 21/768* | (2006.01) |
| *C23C 16/18* | (2006.01) |
| *C23C 16/455* | (2006.01) |
| *C23C 16/56* | (2006.01) |
| *H01L 21/285* | (2006.01) |
| *H01L 21/3213* | (2006.01) |
| *H01L 21/67* | (2006.01) |
| *C23C 16/04* | (2006.01) |

(52) U.S. Cl.
CPC ...... *H01L 21/76879* (2013.01); *C23C 16/045* (2013.01); *C23C 16/18* (2013.01); *C23C 16/45525* (2013.01); *C23C 16/45553* (2013.01); *C23C 16/56* (2013.01); *H01L 21/28562* (2013.01); *H01L 21/28568* (2013.01); *H01L 21/32135* (2013.01); *H01L 21/67069* (2013.01); *H01L 21/67196* (2013.01)

(58) Field of Classification Search
None
See application file for complete search history.

(56) References Cited

U.S. PATENT DOCUMENTS

2012/0164328 A1  6/2012 Kojima et al.
2017/0032990 A1* 2/2017 Lin .......................... C23F 1/12

FOREIGN PATENT DOCUMENTS

JP    2011-063848    3/2011

* cited by examiner

*Primary Examiner* — Thien F Tran (57) ABSTRACT

In a film forming method for forming a cobalt film on a target substrate having a recess formed in a surface thereof to fill the recess with the cobalt film, the recess is partially filled by forming a cobalt film on the target substrate by an ALD method or a CVD method using an organic metal compound gas. The cobalt film is partially etched by supplying an etching gas containing β-diketone gas and NO gas to the target substrate. Then, the recess is further filled by forming a cobalt film on the target substrate by the ALD method or the CVD method using an organic metal compound gas.

15 Claims, 10 Drawing Sheets

FIG. 10A SAMPLE 1 (FILM FORMATION → FILM FORMATION)

FIG. 10B SAMPLE 2 (FILM FORMATION → ETCHING → FILM FORMATION)

FILM FORMING METHOD AND FILM FORMING SYSTEM

CROSS-REFERENCE TO RELATED APPLICATIONS

This application claims priority to Japanese Patent Application No. 2016-176421 filed on Sep. 9, 2016, the entire contents of which are incorporated herein by reference.

FIELD OF THE INVENTION

The disclosure relates to a film forming method and a film forming system.

BACKGROUND OF THE INVENTION

In a semiconductor device manufacturing process, a cobalt film is considered as a seed of Cu wiring or as a contact with Si in a MOS type semiconductor. As for a method for forming a cobalt film, there is known a chemical vapor deposition method (CVD method) using an organic metal compound gas (see, e.g., Japanese Patent Application Publication No. 2011-63848).

Recently, cobalt attracts attention as an alternative for tungsten which is filled in a via hole or the like.

However, in the case of forming a cobalt film by CVD using an organic metal to fill a via hole as disclosed in Japanese Patent Application Publication No. 2011-63848, a seam that is a space where no film is formed may be generated in the cobalt film. This is because a film forming rate near an opening of a hole is greater than a film forming rate at a bottom of the hole.

SUMMARY OF THE INVENTION

In view of the above, the disclosure provides a technique for preventing a seam from being generated at the time of filling a recess such as a via hole or the like with a cobalt film.

In accordance with a first aspect, there is provided a film forming method for forming a cobalt film on a target substrate having a recess formed in a surface thereof to fill the recess with the cobalt film, the method including: a first step of partially filing the recess by forming a cobalt film on the target substrate by an ALD method or a CVD method using an organic metal compound gas; a second step of partially etching the cobalt film by supplying an etching gas containing β-diketone gas and NO gas to the target substrate; and a third step of further filling the recess by forming a cobalt film on the target substrate by the ALD method or the CVD method using an organic metal compound gas.

In accordance with a second aspect, there is provided a film forming system for performing the film forming method described above. The film forming system includes: a film forming apparatus configured to perform the first step and the third step; an etching apparatus configured to perform the second step; and a vacuum transfer chamber connected to the film forming apparatus and the etching apparatus, the vacuum transfer chamber having a transfer unit configured to transfer a target substrate between the film forming apparatus and the etching apparatus.

In accordance with a third aspect, there is provided a film forming system for performing the film forming method described above. The film forming system includes: a film forming and etching apparatus including a single chamber, a film forming gas supply unit configured to supply a film forming gas used in the film formation of the first step and the third step into the chamber, and an etching gas supply unit configured to supply the etching gas used in the etching of the second step into the chamber.

In accordance with a fourth aspect, there is provided a storage medium storing a program which is executed on a computer to control a film forming system, wherein the program, when executed, controls the film forming system through the computer to perform the film forming method described above.

In accordance with the present disclosure, the cobalt film is formed on the target substrate having a recess formed on a surface thereof, and the recess is filled with the cobalt film. The cobalt film is formed on the target substrate by the ALD method or the CVD method using an organic metal compound gas to partially fill the recess. Next, the etching is performed by the etching gas containing β-diketone gas and NO gas and, then, the cobalt film is formed again in the above-described manner. Therefore, overhang hardly occurs and a seam is hardly generated in the cobalt film filling the recess.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Hereinafter, embodiments will be described with reference to the accompanying drawings.

(Embodiment of Film Forming Method)

Figure 1:
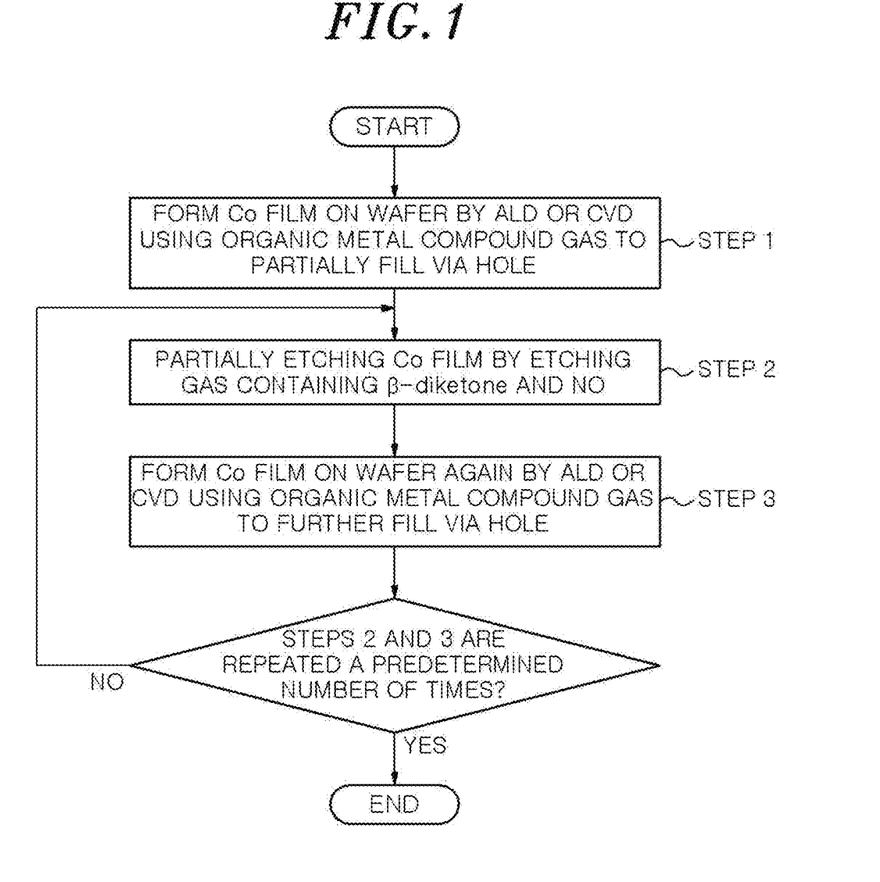
FIG. 1 is a flowchart showing a film forming method according to an embodiment.

First, an embodiment of a film forming method will be described with reference to a flowchart of FIG. 1 and process cross sectional views of FIG. 2.

Figure 2A:
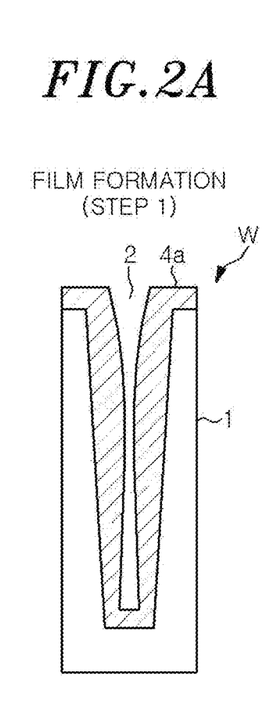
FIGS. 2A to 2E are process cross sectional views showing the film forming method according to the embodiment.

In the present embodiment, first, as shown in FIG. 2A, a Co film 4a is formed on a semiconductor wafer W (hereinafter, simply referred to as "wafer") as a target substrate, in which a via hole 2 is formed in an interlayer insulating film 1, by an ALD (atomic layer deposition) method or a CVD method using an organic metal compound gas to thereby partially fill the via hole 2 such that a seam is not generated (step 1).

Figure 2B:
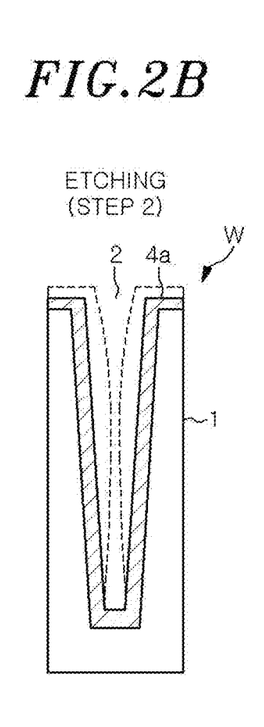

Next, as shown in FIG. 2B, the previously formed Co film 4a is etched such that a V-shaped cross section is obtained by supplying an etching gas containing β-diketone and nitrogen monoxide (NO) to the wafer W (step 2).

Figure 2C:
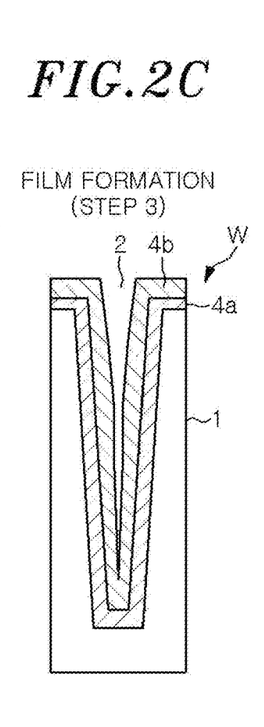

Then, as shown in FIG. 2C, a Co film 4b is formed again by the ALD method or the CVD method using an organic metal compound gas to thereby further fill the via hole 2 (step 3).

Figure 2D:
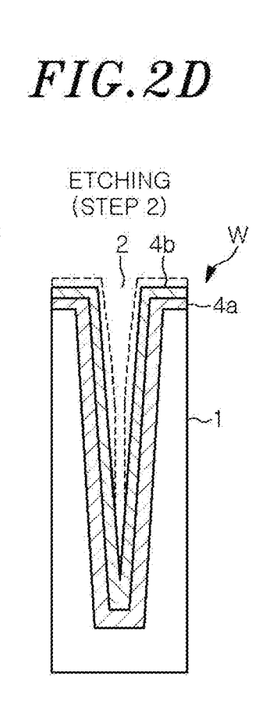
Figure 2E:
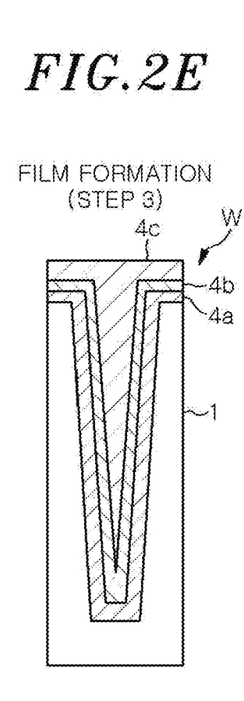

When the via hole 2 is substantially filled by repeating the steps 2 and 3 a predetermined number of times, the filling of the via hole 2 is completed. FIGS. 2A to 2E illustrate an example in which the steps 2 and 3 are repeated twice. Specifically, the filling of the via hole 2 is completed by performing the etching of the step 2 after the step 3 as shown in FIG. 2D and then performing the step 3 of forming a Co film 4c as shown in FIG. 2E.

Figure 3:
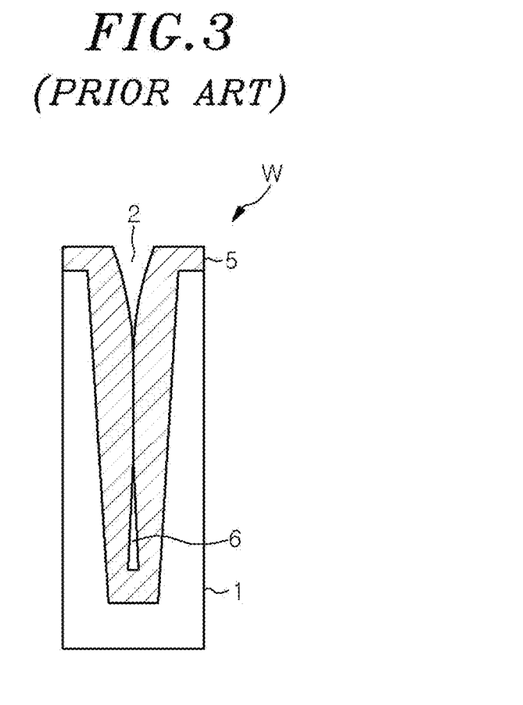
FIG. 3 is a cross sectional view showing a filling state in the case of filling a via hole with a Co film by a conventional film forming method.

Conventionally, the via hole is filled by performing Co film formation once. However, in that case, as shown in FIG. 3, overhang occurs near an opening of the via hole 2 and a seam 6 is generated in a Co film 5 formed in the via hole 2, because a film forming rate near the opening of the via hole 2 is greater than a film forming rate at a bottom of the via hole 2.

On the contrary, in the present embodiment, after the formation of the Co film 4a in the step 1, the etching is performed by using β-diketone and NO in the step 2. Therefore, the Co film in the via hole 2 can be etched with high controllability such that a V-shaped cross section is obtained. Accordingly, the overhang hardly occurs during the formation of the Co film 4b in the step 3 and the via hole 2 can be filled substantially without a seam.

The steps 2 and 3 may be performed once as long as the filling of the via hole can be completed. However, it is preferable to repeat the steps 2 and 3 twice or more as in the present embodiment. By repeating the steps 2 and 3 twice or more, the via hole can be filled in multiple steps and the generation of a seam can be more reliably prevented.

The Co film formation in the steps 1 and 3 is performed by the ALD method or the CVD method using an organic metal compound gas. At this time, the Co film may be formed by supplying an organic metal compound gas and a reduction gas and reducing the organic metal compound gas. Alternatively, the Co film may be formed by thermally decomposing the organic metal compound gas. In the case of the ALD method, the Co film is formed by alternately supplying the organic metal compound gas and the reduction gas. After the supply of the organic metal compound gas and after the supply of the reduction gas, a purge process is performed in the chamber to remove a residual gas from a wafer surface.

As for the organic metal compound gas, one used in conventional Co film formation using a CVD method may be used. For example, cobalt amidinate disclosed in Japanese Patent Application Publication No. 2011-63848 may be appropriately used. Cobalt amidinate may be, e.g., bis(N-tert-butyl-N'-ethyl-propionamidinate) cobalt(II) (Co(tBu-Et-Et-amd)$_2$). As for a reduction gas when using cobalt amidinate, it is preferable to use a gas containing carboxylic acid, e.g., formic acid or acetic acid. Further, $NH_3$ or $H_2$ may also be used as the reduction gas. Or, two or more of them may be used as the reduction gas.

A film forming temperature is preferably 300° C. or less and more preferably 120° C. to 250° C. A pressure for film formation is preferably 1.33 Pa to 1333 Pa (10 mTorr to 10 Torr). A flow rate of the organic metal compound gas is preferably 50 sccm to 500 sccm. A flow rate of the reduction gas is preferably 50 sccm to 500 sccm.

In addition, as for the organic metal compound gas, bis(cyclopentadienyl)cobalt (cobaltcene) (Journal of Crystal Growth 114 (1991), pp. 364-372) or the like may be used.

The etching of the Co film in the step 2 is performed by using a processing gas containing β-diketone and NO gas as described above. As for β-diketone, it is preferable to use a compound in which a carbonyl group in a molecule is bonded to an alkyl group containing a halogen atom. For example, hexafluoroacetylacetonate (Hfac) is preferably used. This is because an electron density of an oxygen atom of the carbonyl group is decreased by an inductive effect of the halogen atom and, thus, the hydrogen atom bonded with the oxygen atom is easily dissociated to a hydrogen ion. However, in the case of using only β-diketone, Co that is a metal is not etched. Co can be appropriately etched by using β-diketone together with NO. The Co film near the via hole can be etched by combination of NO and β-diketone, especially, β-diketone in which an alkyl group containing a halogen atom is bonded with a carbonyl group in a molecule such as Hfac. Also, a period of time required until NO and β-diketone reach the bottom of the via hole is ensured by controlling a flow rate of NO. Accordingly, the Co film near the bottom of the via hole can be etched. As a result, the Co film can be etched with high controllability and the generation of a seam can be suppressed.

Figure 4:
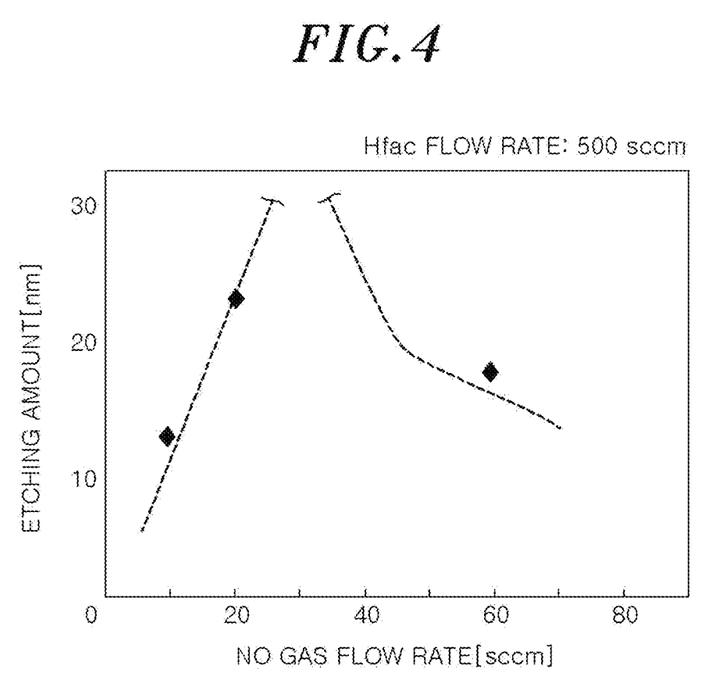
FIG. 4 shows relation between an etching amount and a flow rate of NO gas with respect to Hfac gas having a flow rate of 500 sccm in the case of using Hfac and No as an etching gas.

A flow rate of β-diketone gas (Hfac gas) is preferably within a range from 5 sccm to 1000 sccm. A flow rate of NO gas is preferably within a range from 10 sccm to 250 sccm and more preferably within a range from 60 sccm to 250 sccm with respect to β-diketone gas having a flow rate of 500 sccm. A flow rate ratio of a flow rate of the NO gas to a flow rate of the β-diketone gas is preferably within a range from 0.02 to 0.5 and more preferably within a range from 0.12 to 0.5. In the case of using Hfac as β-diketone, the etching amount is abruptly increased in a low NO region where the gas flow rate of the NO gas is 30 sccm or less with respect to the Hfac gas having a flow rate of 500 sccm, as can be seen from FIG. 4. However, in the low NO region, the etching tends to occur mainly at the opening of the via hole. On the other hand, when the flow rate of the NO gas is 60 sccm or more, a period of time required until the gases reach the vicinity of the bottom of the via hole is ensured and, thus, the Co film near the bottom of the via hole can be etched. In the low NO region where the flow rate of the NO gas is 30 sccm or less, the state of the etching surface of the Co film tends to deteriorate. However, when the flow rate of the NO gas is 60 sccm or above, the state of the etching surface of the Co film is improved.

The temperature for etching is preferably 200° C. to 250° C. When the temperature is lower than 200° C., the etching rate is decreased and the productivity becomes poor. When the temperature exceeds 250° C., the etching rate is increased but carbon is easily captured due to decomposition. The temperature for etching is more preferably 220° C. to 240° C. In that range, the etching rate becomes stable and the carbon capturing can be effectively prevented.

A pressure for etching is preferably 133.33 Pa to 13333 Pa (1 Torr to 100 Torr).

The Co film formation in the steps 1 and 3 and the etching in the step 2 may be performed in different apparatuses (chambers). In that case, it is preferable to connect a film forming apparatus and an etching apparatus to a vacuum transfer chamber and perform processing in a vacuum system for transferring a wafer under a vacuum atmosphere between the film forming apparatus and the etching apparatus by a transfer unit provided in the vacuum transfer chamber.

Since a preferable temperature range for the Co film formation and a preferable temperature range for the etching are overlapped, the Co film formation and the etching can be performed at the same or similar temperature. Therefore, the processes of the steps 1 to 3 can be performed in a single chamber. Accordingly, the processes of the steps 1 to 3 can be performed while ensuring a high throughput.

(Film Forming System)

Hereinafter, an example of a film forming system capable of performing the film forming method of the present disclosure will be described.

(First Example of Film Forming System)

Figure 5:
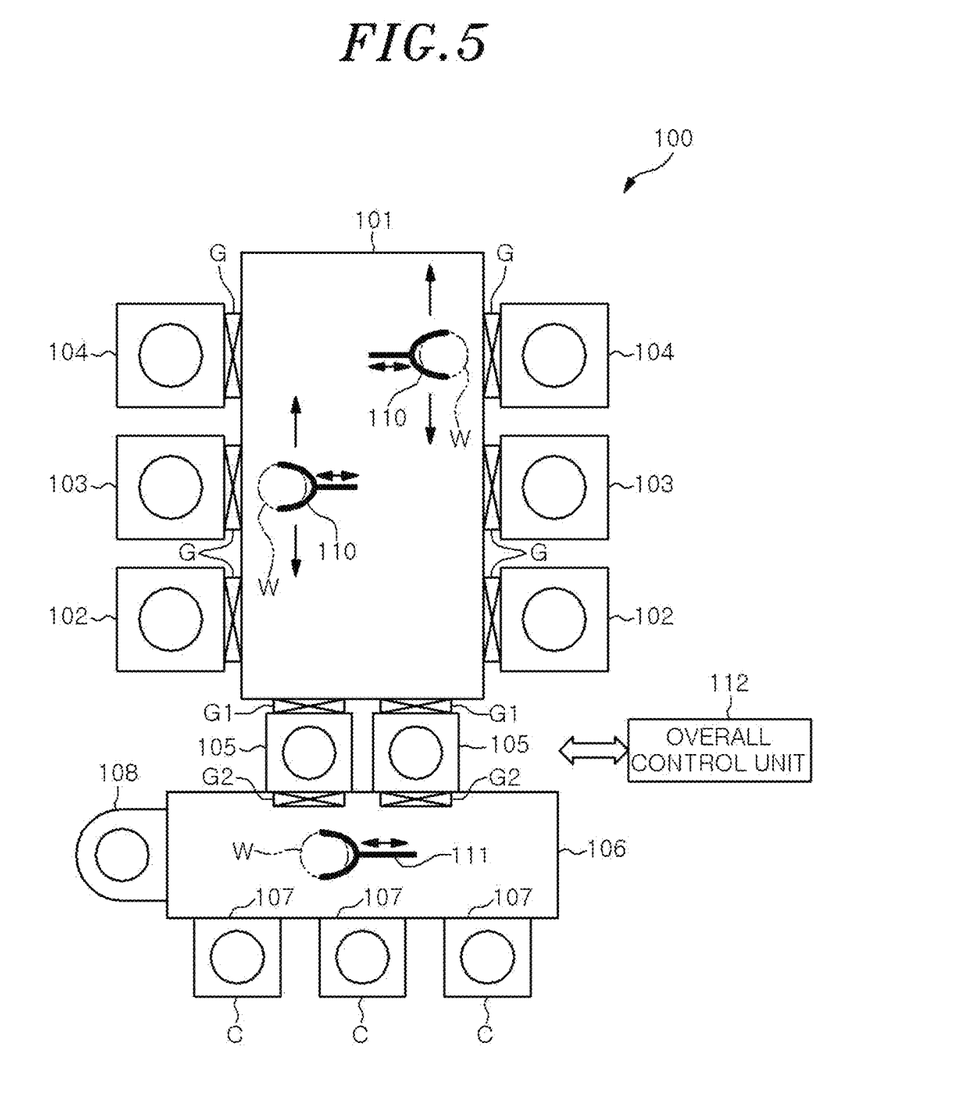
FIG. 5 schematically shows a first example of a film forming system capable of performing the film forming method of the present disclosure.

FIG. 5 schematically shows a first example of the film forming system capable of performing the film forming method of the present disclosure.

As shown in FIG. 5, a film forming system 100 in this example includes a vacuum transfer chamber 101 having a rectangular cross section. A cooling apparatus 102, a film forming apparatus 103 and an etching apparatus 104 are connected to one long side of the vacuum transfer chamber 101 through respective gate valves G. Another cooling apparatus 102, another film forming apparatus 103 and another etching apparatus 104 are connected to the other long side of the vacuum transfer chamber 101 through respective gate valves G. The vacuum transfer chamber 101 is exhausted by a vacuum pump and a pressure in the vacuum transfer chamber 101 is maintained at a predetermined vacuum level. The film forming apparatuses 103 perform Co film formation. The etching apparatuses 104 perform etching of the Co film after the Co film formation. The cooling apparatuses 102 perform cooling of the wafer W when the Co film is formed again by the film forming apparatus 103 after the completion of the etching in the etching apparatus 104.

Two load-lock chambers 105 are connected to one of short sides of the vacuum transfer chamber 101 through respective gate valves G1. An atmospheric transfer chamber 106 is provided at the opposite side to the vacuum transfer chamber 101 with the load-lock chambers 105 interposed therebetween. The load-lock chambers 105 are connected to the atmospheric transfer chamber 106 via respective gate valves G5. The load-lock chambers 105 are controlled to an atmospheric pressure or a vacuum at the time of transferring the wafer W between the atmospheric transfer chamber 106 and the vacuum transfer chamber 101.

Three carrier attachment ports 107 to which carriers C, e.g., FOUPs or the like, accommodating wafers W are attached are provided at a wall of the atmospheric transfer chamber 106 which is opposite to a wall connected to the load-lock chambers 105. An alignment chamber 108 for performing alignment of the wafer W is provided at a sidewall of the atmospheric transfer chamber 106. A downflow of clean air is formed in the atmospheric transfer chamber 106.

Two wafer transfer units 110 are provided in the vacuum transfer chamber 101. One of the wafer transfer units 110 is configured to load/unload a wafer W into/from the cooling apparatus 102, the Co film forming apparatus 103 and the etching apparatus 104 which are connected to one long side of the vacuum transfer chamber 101, and one of the load-lock chambers 105. The other one of the wafer transfer units 110 is configured to load/unload a wafer W into/from the cooling apparatus 102, the Co film forming apparatus 103 and the etching apparatus 104 which are connected to the other long side of the vacuum transfer chamber 101, and the other one of the load-lock chambers 105.

A wafer transfer unit 111 is provided in the atmospheric transfer chamber 106. The wafer transfer unit 111 is configured to transfer a wafer W to the carriers C, the load-lock chambers 105 and the alignment chamber 108.

The film forming system 100 includes an overall control unit 112. The overall control unit 112 includes a main control unit, an input device (keyboard, mouse or the like), an output device (printer or the like), a display device (display or the like), and a storage device (storage medium). The main control unit has a CPU (computer) for controlling the respective components of the cooling apparatus 102, the film forming apparatus 103 and the etching apparatus 104, the gas exhaust unit and the wafer transfer unit 110 of the vacuum transfer chamber 101, the gas exhaust unit and the gas supply unit of the load-lock chambers 105, the wafer transfer unit 111 of the atmospheric transfer chamber 106, the driving units of the gate valves G, G1 and G2, and the like. The main control unit of the overall control unit 112 allows the film forming system 100 to perform a predetermined operation based on, e.g., a process recipe stored in a storage medium set in the storage device or a storage medium installed in the storage device.

Figure 6:
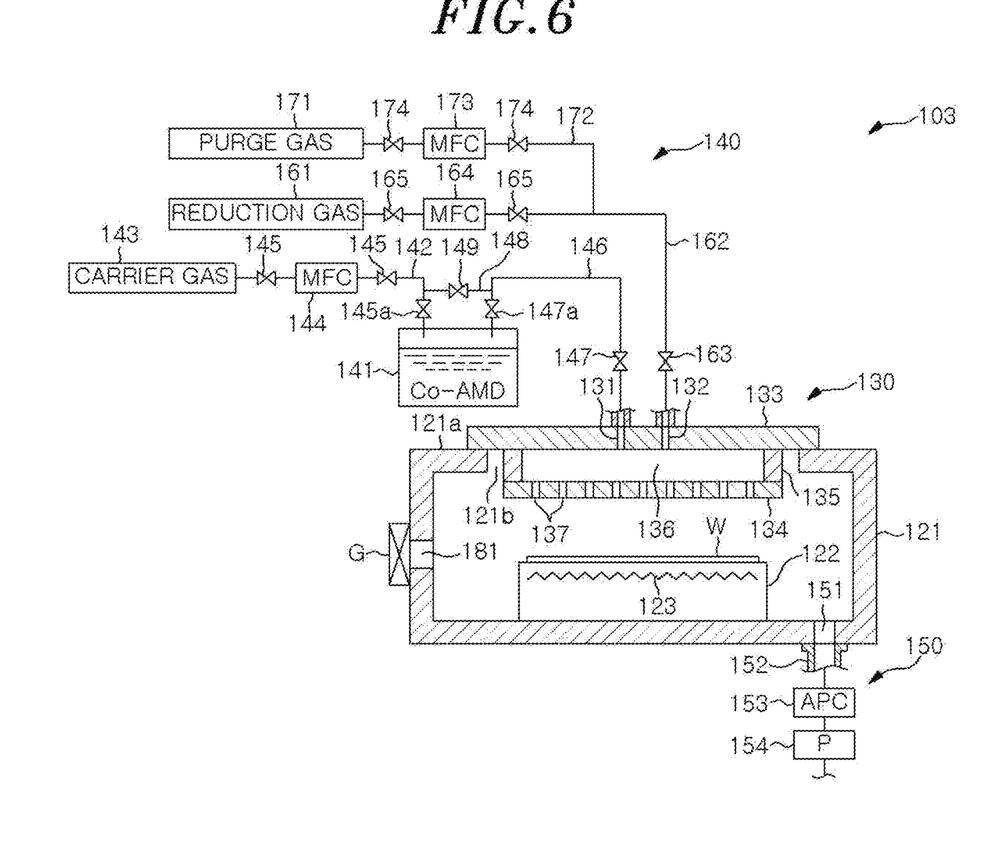
FIG. 6 is a cross sectional view showing a film forming apparatus installed in the film forming system shown in FIG. 5.

Hereinafter, the film forming apparatus 103 will be described.

FIG. 6 is a cross sectional view of the film forming apparatus 103. As shown in FIG. 6, the film forming apparatus 103 includes: a sealed chamber 121; a mounting table 122, provided in the chamber 121, for mounting thereon a wafer W in a substantially horizontal state; a shower head 130 provided to face the mounting table 122; a gas supply unit 140 for supplying a film forming gas to the shower head 130; and a gas exhaust unit 150.

The mounting table 122 has a substantially circular shape when seen from the top. The mounting table 122 is fixed to a bottom portion of the chamber 121. A heater 123 is embedded in the mounting table 122. The wafer W can be heated to a predetermined film forming temperature by controlling a voltage applied to the heater 123. Although it is not illustrated, the mounting table 122 is provided with a plurality of, e.g., three, elevation pins for vertically moving the wafer W. The elevation pins can protrude and retract with respect to a wafer mounting surface.

A circular opening 121b is formed at a ceiling wall 121a of the chamber 121. A shower head 130 is fitted in the circular opening 121b to protrude into the chamber 121. The shower head 130 injects the film forming gas supplied from the gas supply unit 140 to be described later into the chamber 121. A first gas inlet line 131 and a second gas inlet line 132 are provided at an upper portion of the shower head 130. The shower head 130 includes a base member 133, a shower plate 134, and a cylindrical sidewall 135 provided between the base member 133 and the shower plate 134. A gas diffusion space 136 is formed inside the shower head 130. A plurality of gas injection holes 137 is formed in the shower plate 134. The shower head 130 is heated by a heater (not shown).

The gas supply unit 140 includes a film forming material tank 141 for storing cobalt amidinate (Co-AMD), e.g., bis(N-tert-butyl-N'-ethyl-propionamidinate) cobalt(II) (Co (tBu-Et-Et-amd)$_2$). A heater (not shown) is provided around the film forming material tank 141, so that a film forming material in the film forming material tank 141 can be heated to an appropriate temperature.

A carrier gas line 142 for supplying a carrier gas that is an inert gas, e.g., Ar gas, N$_2$ gas or the like, is inserted into the film forming material tank 141 from the top thereof. A carrier gas supply source 143 is connected to the carrier gas line 142. A mass flow controller 144 as a flow rate controller and opening/closing valves 145 disposed at both sides of the mass flow controller 144 are provided in the carrier gas line 142. In addition, one end of a source gas feed line 146 is into the film forming material tank 141 from the top thereof. The other end of the source gas feed line 146 is connected to the first gas inlet line 131 of the shower head 130. An opening/closing valve 147 is provided in the source gas feed line 146 at a position close to the shower head 130.

The carrier gas line 142 and the source gas feed line 146 are connected by a bypass line 148. A valve 149 is provided in the bypass line 148. A valve 145a is provided in the carrier gas line 142 at a downstream side of the connecting portion with the bypass line 148 and a valve 147a is provided in the source gas feed line 146 at an upstream side of the connecting portion with the bypass line 148. Therefore, by closing the valves 145a and 147a and opening the valve 149, the carrier gas from the carrier gas supply source 143 can be supplied as a purge gas or the like into the chamber 121 through the carrier gas line 142, the bypass line 148 and the source gas feed line 146.

The gas supply unit 140 further includes a reduction gas supply source 161 for supplying a reduction gas such as a gas containing carboxylic acid, NH$_3$ gas, H$_2$ gas or the like. One end of a reduction gas line 162 is connected to the reduction gas supply source 161. The other end of the reduction gas line 162 is connected to the second gas inlet line 132 of the shower head 130. An opening/closing valve 163 is provided in the reduction gas line 162 at a position close to the shower head 130. A mass flow controller 164 as a flow rate controller and opening/closing valves 165 disposed at both sides of the mass flow controller 164 are provided in the reduction gas line 162 at a position close to the reduction gas supply source 161. The gas supply unit 140 further includes a purge gas supply source 171 for supplying a purge gas that is an inert gas, e.g., Ar gas, N$_2$ gas or the like. One end of a purge gas line 172 is connected to the purge gas supply source 171. The other end of the purge gas line 172 joins with the reduction gas line 162. A mass flow controller 173 as a flow rate controller and opening/closing valves 174 disposed at both sides of the mass flow controller 173 are provided in the purge gas line 172.

The gas exhaust unit 150 includes: a gas exhaust line 152 connected to a gas exhaust port 151 formed at a bottom portion of the chamber 121; an automatic pressure control (APC) valve 153 provided in the gas exhaust line 152, for controlling a pressure in the chamber 121; and a vacuum pump 154 for exhausting the chamber 121 through the gas exhaust line 152. Although it is not shown, a pre-flow line is provided between the source gas feed line 146 and the gas exhaust line 152 and between the reduction gas line 162 and the gas exhaust line 152. These pre-flow lines can be opened/closed by respective valves. Accordingly, the pre-flow of the Co-AMD gas and the reduction gas toward the gas exhaust line 152 can be performed without passing through the chamber 121.

A loading/unloading port 181 through which the wafer W is loaded/unloaded is formed at a sidewall of the chamber 121. The loading/unloading port 181 is connected to the vacuum transfer chamber 101 via a gate valve G.

Figure 7:
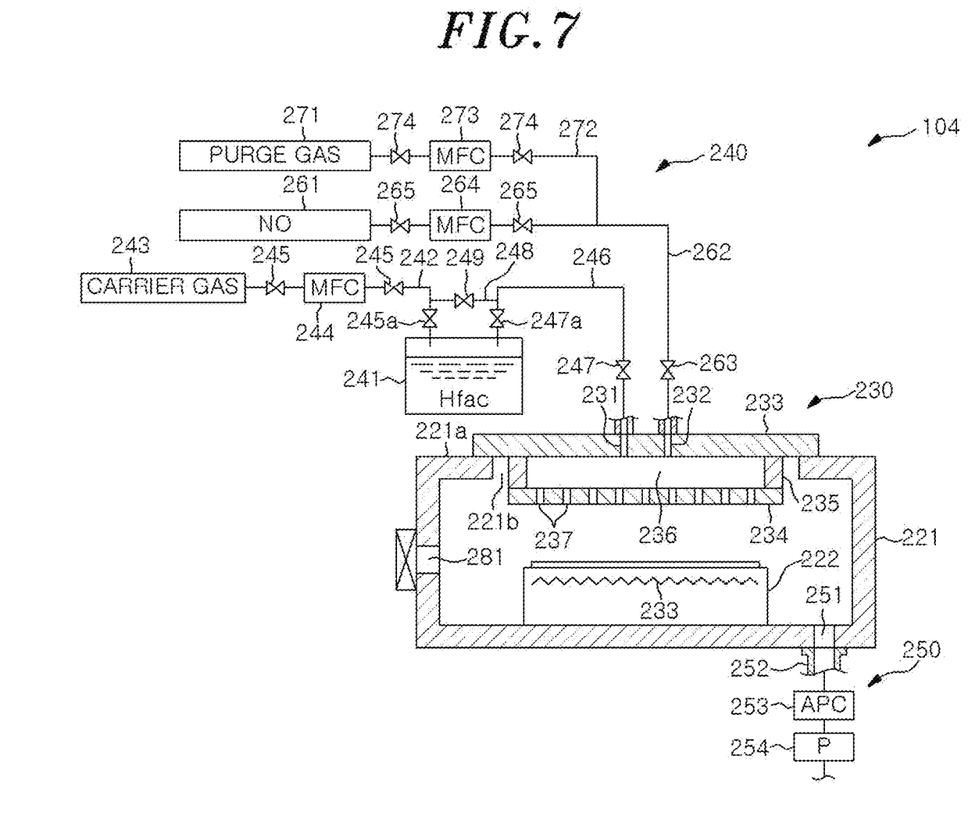
FIG. 7 is a cross sectional view showing an etching apparatus installed in the film forming system shown in FIG. 5.

Hereinafter, the etching apparatus 104 will be described. FIG. 7 is a cross sectional view of the etching apparatus 104.

As shown in FIG. 7, the etching apparatus 104 includes: a sealed chamber 221; a mounting table 222, provided in the chamber 221, for mounting thereon the wafer W in a substantially horizontal state; a shower head 230 provided to face the mounting table 222; a gas exhaust unit 240 for supplying an etching gas to the shower head 230; and a gas exhaust unit 250.

The mounting table 222 has a substantially circular shape when seen from the top. The mounting table 222 is fixed to a bottom portion of the chamber 221. A heater 223 is embedded in the mounting table 222. The wafer W can be heated to a predetermined etching temperature by controlling a voltage applied to the heater 223. Although it is not illustrated, the mounting table 222 is provided with a plurality of, e.g., three elevation pins for vertically moving the wafer W. The elevation pins can protrude and retract with respect to a wafer mounting surface.

A circular opening 221b is formed at a ceiling wall 221a of the chamber 221. A shower head 230 is fitted in the circular opening 221b to protrude into the chamber 221. The shower head 230 injects the etching gas supplied from the gas supply unit 240 to be described later into the chamber 221. A third gas inlet line 231 and a fourth gas inlet line 232 are provided at an upper portion of the shower head 230. The shower head 230 includes a base member 233, a shower plate 234, and a cylindrical sidewall 235 provided between the base member 233 and the shower plate 234. A gas diffusion space 236 is formed inside the shower head 230. A plurality of gas injection holes 237 is formed in the shower plate 234. The shower head 230 is heated by a heater (not shown).

The gas supply unit 240 includes a tank 241 for storing β-diketone that is one of the components of the etching gas, e.g., a compound in which a carbonyl group in a molecule is bonded to an alkyl group containing a halogen atom, e.g., hexafluoroacetylacetonate (Hfac). A heater (not shown) is provided around the tank 241, so that β-diketone in the tank 241 can be heated to an appropriate temperature.

A carrier gas line 242 for supplying a carrier gas that is an inert gas, e.g., Ar gas, N$_2$ gas or the like, is inserted into the tank 241 from the top thereof. A carrier gas supply source 243 is connected to the carrier gas line 242. A mass flow controller 244 as a flow rate controller and opening/closing valves 245 disposed at both sides of the mass flow controller 244 are provided in the carrier gas line 242. In addition, one end of a gas feed line 246 is inserted into the film forming material tank 241 from the top thereof. The other end of the gas feed line 246 is connected to the third gas inlet line 231 of the shower head 230. An opening/closing valve 247 is provided in the gas feed line 246 at a position close to the shower head 230.

The carrier gas line 242 and the gas feed line 246 are connected by a bypass line 248. A valve 49 is disposed in the bypass line 248. A valves 245a is provided in the carrier gas line 242 at a downstream side of the connecting portion with the bypass line 248 and a valve 247a is provided in the gas feed line 246 at an upstream side of the connecting portion with the bypass line 248. Therefore, by closing the valves 245a and 247a and opening the valve 49, the carrier gas from the carrier gas supply source 243 can be supplied as a purge gas or the like into the chamber 221 through the carrier gas line 242, the bypass line 248 and the gas feed line 246.

The gas supply unit 240 further includes an NO gas supply source 261 for supplying NO gas that is another component of the etching gas. One end of an NO gas line 262 is connected to the NO gas supply source 261. The other end of the NO gas line 262 is connected to the fourth gas inlet line 232 of the shower head 230. An opening/closing valve 263 is disposed in the NO gas line 262 at a position close to the shower head 230. A mass flow controller 264 as a flow rate controller and opening/closing valves 265 disposed at both sides of the mass flow controller 264 are provided in the NO gas line 262 at a position close to the NO gas supply source 261. The gas supply unit 240 further includes a purge gas supply source 271 for supplying a purge gas that is an inert gas, e.g., Ar gas, $N_2$ gas or the like. One end of a purge gas line 272 is connected to the purge gas supply source 271. The other end of the purge gas line 272 joins with the NO gas line 262. A mass flow controller 273 as a flow rate controller and opening/closing valves 274 disposed at both sides of the mass flow controller 273 are provided in the purge gas line 272.

The gas exhaust unit 250 includes: a gas exhaust line 252 connected to a gas exhaust port 251 formed at a bottom portion of the chamber 221; an automatic pressure control (APC) valve 253 disposed in the gas exhaust line 252, for controlling a pressure in the chamber 221; and a vacuum pump 254 for exhausting the chamber 221 through the gas exhaust line 252. Although it is not shown, a pre-flow line is provided between the gas feed line 246 and the gas exhaust line 252 and between the NO gas line 262 and the gas exhaust line 252. These pre-flow lines can be opened/closed by valves. Accordingly, the pre-flow of the β-diketone gas and the NO gas toward the gas exhaust line 252 can be performed without passing through the chamber 221.

A loading/unloading port 281 through which the wafer W is loaded/unloaded is formed at a sidewall of the chamber 221. The loading/unloading port 281 is connected to the vacuum transfer chamber 101 via a gate valve G.

The configurations of the components of the etching apparatus 104 except for the gas supply unit 240, i.e., the chamber 221, the mounting table 222, the shower head 230, the gas exhaust unit 250, are the same as those of the film forming apparatus 103, i.e., the chamber 121, the mounting table 122, the shower head 130 and the gas exhaust unit 150.

In the cooling apparatus 102, a mounting table having a temperature control unit is provided in a chamber. When the etching temperature in the etching apparatus 104 is higher than the film forming temperature in the film forming apparatus 103, the cooling apparatus 102 cools the wafer W to a temperature close to the film forming temperature before the wafer W etched by the etching apparatus 104 is transferred to the film forming apparatus 103.

In the film forming system 100 configured as described above, first, the wafer W is unloaded from the carrier C connected to the atmospheric transfer chamber 106 by the wafer transfer unit 111. Then, the wafer W is loaded into one of the load-lock chambers 105 by opening the gate valve G2 of the corresponding load-lock chamber 105. Next, the gate valve G2 is closed and the load-lock chamber 105 is evacuated to vacuum.

When a pressure in the load-lock chamber 105 reaches a predetermined vacuum level, the gate valve G1 is opened and the wafer W is unloaded from the load-lock chamber 105 by the wafer transfer unit 110. Then, the gate valve G of the film forming apparatus 103 is opened and the wafer W held by the wafer transfer unit 110 is loaded into the film forming apparatus 103.

The wafer W is loaded into the chamber 121 of the film forming apparatus 103 by the wafer transfer unit 110 and mounted on the mounting table 122. Then, the wafer transfer unit 110 is retreated and the gate valve G is closed. Next, the wafer W is heated to a predetermined temperature by the heater 123 and the chamber 121 is exhausted. A pressure in the chamber 121 is controlled by supplying a purge gas and a carrier gas. Accordingly, the pre-flow of the Co-AMD gas, e.g., Co(tBu-Et-Et-amd)$_2$ gas, and the reduction gas is performed. Thereafter, the pre-flow lines are switched to the source gas feed line 146 and the reduction gas line 162, and a Co film is formed by supplying the Co-AMD gas and the reduction gas into the chamber 121 through the shower head 130. At this time, the Co film may be formed by the CVD method by simultaneously supplying the Co-AMD gas and the reduction gas or by the ALD method for alternately supplying the Co-AMD gas and the reduction gas with a process of purging the inside of the chamber 121 interposed therebetween.

After the via hole is partially filled by forming the Co film, the supply of the Co-AMD gas and the reduction gas is stopped and the inside of the chamber 121 is purged. Then, the gate valve G of the film forming apparatus 103 is opened and the wafer W after the film formation is unloaded from the chamber 121 by the wafer transfer unit 110. Next, the gate valve G of the etching apparatus 104 is opened and the wafer W held by the wafer transfer unit 110 is loaded into the etching apparatus 104.

The wafer W is loaded into the chamber 221 of the etching apparatus 104 by the wafer transfer unit 110 and mounted on the mounting table 222. Then, the wafer transfer unit 110 is retreated and the gate valve G is closed. Thereafter, the wafer W is heated to a predetermined temperature by the heater 223 and the chamber 221 is exhausted. A pressure in the chamber 221 is controlled by supplying a purge gas and a carrier gas, and the pre-flow of β-diketone gas, e.g., Hfac gas, and NO gas as the etching gas is performed. Then, the pre-flow lines are switched to the gas feed line 246 and the NO gas line 262, and the Co film is etched by supplying the β-diketone gas and the NO gas as the etching gas into the chamber 221 through the shower head 230.

After the Co film is etched in a desired shape, the supply of the β-diketone gas and the NO gas is stopped and the inside of the chamber 221 is purged. Next, the gate valve G of the etching apparatus 104 is opened and the wafer W after the etching is unloaded from the chamber 221 by the wafer transfer unit 110.

Then, the wafer W is cooled to a predetermined temperature by the cooling apparatus 102, if necessary, and loaded into the film forming apparatus 103 by the wafer transfer unit 110. A Co film is formed in the above-described manner, so that the etched portion of the Co film in the via hole is filled.

Next, if necessary, the etching by the etching apparatus 104 and the film formation by the film forming apparatus 103 are repeated a predetermined number of times.

After a desired film formation sequence is completed, the wafer W is unloaded by the wafer transfer unit 110. Then, the gate valve G1 is opened and the wafer W is transferred into the load-lock chamber 105 by the wafer transfer unit 110. Next, the gate valve G1 is closed and a pressure in the load-lock chamber 105 is returned to an atmospheric pressure. Thereafter, the gate valve G2 is opened and the wafer W in the load-lock chamber 105 is returned to the carrier C by the wafer transfer unit 111.

By performing the above-described processes on a plurality of wafers W concurrently, the film formation for a predetermined number of wafers W is completed.

In this example, even when the film forming temperature and the etching temperature are different, the film formation and the etching can be performed consecutively under a vacuum atmosphere. Accordingly, the via hole can be filled with the Co film without generating a seam and while ensuring a high throughput.

(Second Example of Film Forming System)

Figure 8:
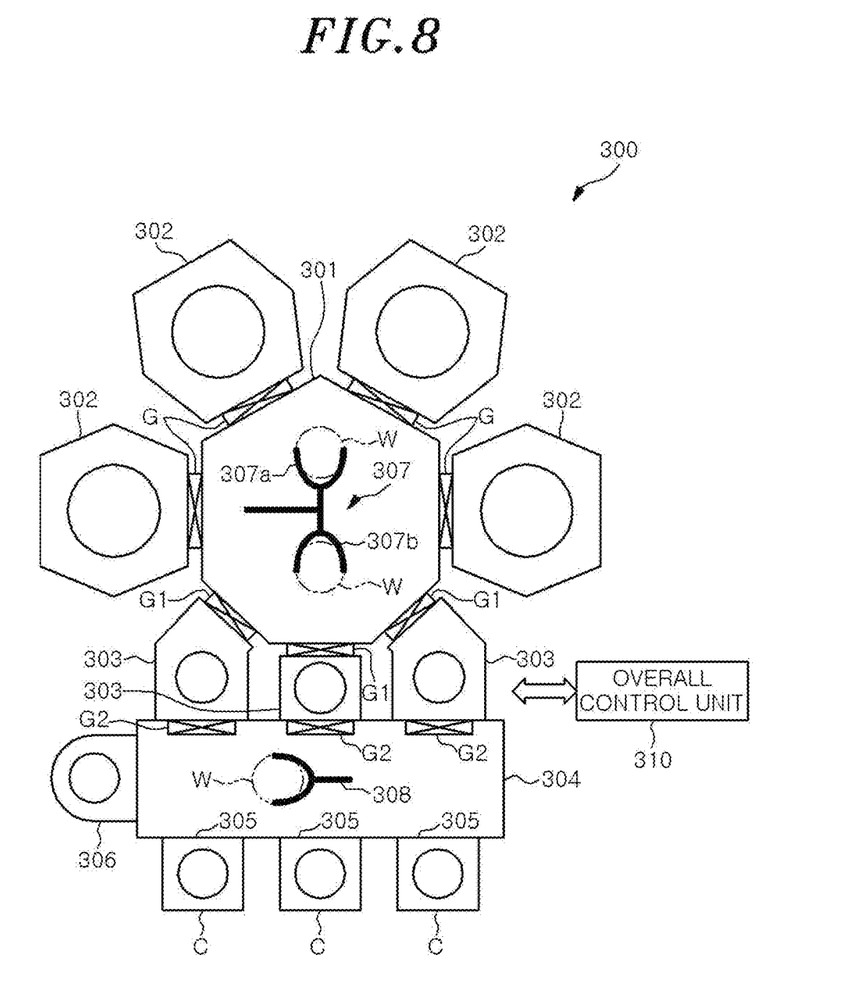
FIG. 8 schematically shows a second example of the film forming system capable of performing the film forming method of the present disclosure.

FIG. 8 schematically shows a second example of the film forming system capable of performing the film forming method of the present disclosure.

As shown in FIG. 8, a film forming system 300 of the present example includes a vacuum transfer chamber 301 having a heptagonal shape when seen from the top. A film forming and etching apparatus 302 capable of performing both of Co film formation and etching is connected to each of four walls of the vacuum transfer chamber 301 through respective gate valves G. The vacuum transfer chamber 301 is exhausted by the vacuum pump, and a pressure in the vacuum transfer chamber 301 is maintained at a predetermined vacuum level.

Three load-lock chambers 303 are respectively connected to the other three walls of the vacuum transfer chamber 301 via gate valves G1. An atmospheric transfer chamber 304 is provided at the opposite side to the vacuum transfer chamber 301 with the load-lock chambers 303 interposed therebetween. The three load-lock chambers 303 are connected to the atmospheric transfer chamber 304 through respective gate valves G2. The load-lock chambers 303 are controlled to an atmospheric pressure or a vacuum at the time of transferring the wafer W between the atmospheric transfer chamber 304 and the vacuum transfer chamber 301.

Three carrier attachment ports 305 to which carriers (FOUPs or the like) C accommodating wafers W are attached are provided at a wall of the atmospheric transfer chamber 304 which is opposite to a wall connected to the load-lock chambers 303. An alignment chamber 306 for performing alignment of a wafer W is provided at a sidewall of the atmospheric transfer chamber 304. A downflow of clean air is formed in the atmospheric transfer chamber 304.

A wafer transfer unit 307 is provided in the vacuum transfer chamber 301. The wafer transfer unit 307 transfers the wafer W to the film forming/etching apparatuses 302 and the load-lock chambers 303. The wafer transfer unit 307 includes two independently movable transfer arms 307a and 307b.

A wafer transfer unit 308 is provided in the atmospheric transfer chamber 304. The wafer transfer unit 308 is configured to transfer a wafer W to the carriers C, the load-lock chambers 303 and the alignment chamber 306.

The film forming system 300 includes an overall control unit 310. The overall control unit 310 includes a main control unit, an input device (keyboard, mouse or the like), an output device (printer or the like), a display device (display or the like), and a storage device (storage medium). The main control unit has a CPU (computer) for controlling the respective components of the film forming and etching apparatuses 302, the gas exhaust unit and the wafer transfer unit 307 of the vacuum transfer chamber 301, the gas exhaust unit and the gas supply unit of the load-lock chambers 303, the wafer transfer unit 308 of the atmospheric transfer chamber 304, the driving units of the gate valves G, G1 and G2, and the like. The main control unit of the overall control unit 310 allows the film forming system 300 to perform a predetermined operation based on, e.g., a process recipe stored in a storage medium set in the storage device or in a storage medium installed in the storage device.

Figure 9:
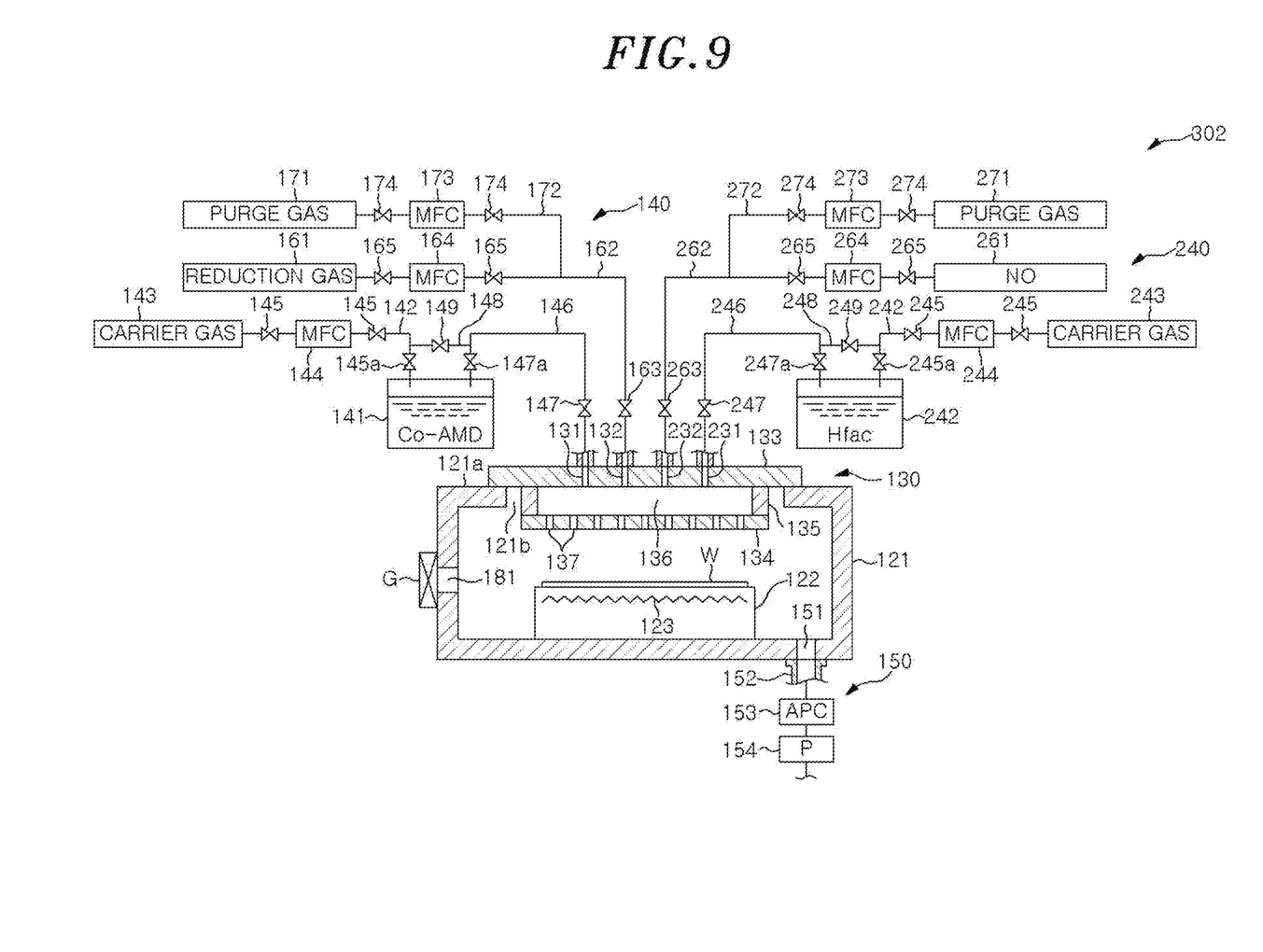
FIG. 9 is a cross sectional view showing a film forming/etching apparatus installed in the film forming system shown in FIG. 8.

Hereinafter, the film forming and etching apparatus 302 will be described.

FIG. 9 is a cross sectional view of the film forming/etching apparatus 302. The film forming/etching apparatus 302 can supply both of a film forming gas and an etching gas into the chamber 121 by employing a configuration in which a gas supply unit 140 for supplying a film forming gas having the same configuration as that of the film forming apparatus 103 and a gas supply unit 240 for supplying an etching gas having the same configuration as that of the etching apparatus 104 are installed at the chamber 121 having the same configuration as that of the film forming apparatus 103 of the first example.

The respective components in the chamber 121 and the respective components of the gas supply units 140 (film forming gas supply unit) and the gas supply unit 240 (etching gas supply unit) are indicated with the same reference numerals as those used in the film forming apparatus 103 and the etching apparatus 104. The shower head 130 is provided with a third and a fourth gas inlet line 231 and 232 for introducing an etching gas in addition to the first and the second gas inlet line 131 and 132 for introducing a film forming gas.

In the film forming system 300 configured as described above, first, the wafer W is unloaded from the carrier C connected to the atmospheric transfer chamber 304 by the wafer transfer unit 308. The gate valve G2 of one of the load-lock chambers 303 is opened and the wafer W is loaded into the corresponding load-lock chamber 303. Then, the gate valve G2 is closed and the load-lock chamber 303 is evacuated to vacuum.

When the pressure in the load-lock chamber 303 reaches a predetermined vacuum level, the gate valve G1 is opened and the wafer W is unloaded from the load-lock chamber 303 by the wafer transfer unit 307. Then, the gate valve G of the film forming/etching apparatus 302 is opened and the wafer W held by the wafer transfer unit 307 is loaded into the film forming/etching apparatus 302.

The wafer W is loaded into the chamber 121 of the film forming/etching apparatus 302 by the wafer transfer unit 307 and mounted on the mounting table 122. Then, the wafer transfer unit 307 is retreated and the gate valve G is closed. The wafer W is heated to a predetermined temperature by the heater 123 and the chamber 121 is exhausted. A pressure in the chamber 121 is controlled by supplying a purge gas and a carrier gas, and the pre-flow of Co-AMD gas, e.g., Co(tBu-Et-Et-amd)$_2$ gas, and a reduction gas is performed. Next, the pre-flow lines are switched to the source gas feed line 146 and the reduction gas line 162 of the film forming gas supply unit 140, and a Co film is formed by supplying the Co-AMD gas and the reduction gas into the chamber 121 through the shower head 130. At this time, the Co film may be formed by the CVD method by supplying the Co-AMD gas and the reduction gas at the same time or by the ALD method for alternately supplying the Co-AMD gas and the reduction gas with a process of purging the inside of the chamber 121 interposed therebetween.

After the via hole is partially filled with the Co film, the supply of the Co-AMD gas and the reduction gas is stopped and the inside of the chamber 121 is purged. Then, if necessary, the temperature of the heater 123 is controlled to heat the wafer W to a predetermined etching temperature. The chamber 121 is exhausted and the pressure in the chamber 121 is controlled by supplying a purge gas and a carrier gas, and the pre-flow of the β-diketone gas, e.g., Hfac gas, and the NO gas as the etching gas is performed. Next, the pre-flow lines are switched to the gas feed line 246 and the NO gas line 262 of the etching gas supply unit 240, and the Co film is etched by supplying the β-diketone gas and the NO gas as the etching gas into the chamber 121 through the shower head 130.

After the Co film is etched in a desired shape, the supply of the β-diketone gas and the NO gas is stopped and the inside of the chamber 121 is purged.

Then, the Co-AMD gas and the reduction gas are supplied from the film forming gas supply unit 140 into the chamber 121 in the same manner as in the previous film formation. As a consequence, the etched portion of the Co film in the via hole is filled.

Next, the etching and the film formation are repeated a predetermined number of times in the film forming/etching apparatus 302, if necessary.

After a desired film formation sequence is completed, the wafer W is unloaded by the wafer transfer unit 307. Then, the gate valve G1 is opened and the wafer W is transferred into the load-lock chamber 303 by the wafer transfer unit 307. Next, the gate valve G1 is closed and a pressure in the load-lock chamber 303 is returned to an atmospheric pressure. Thereafter, the gate valve G2 is opened and the wafer W in the load-lock chamber 303 is returned to the carrier C by the wafer transfer unit 308.

By performing the above-described processes on a plurality of wafers W concurrently, the film formation on a predetermined number of wafers W is completed.

In this example, when the Co film formation and the etching are performed at the same or similar temperature, the Co film formation and the etching can be repeatedly performed in a single chamber 121 substantially without changing a temperature of the mounting table 122 and without transferring the wafer. Accordingly, the via hole can be filled with the Co film without generating a seam and while ensuring a high throughput.

Test Example

Next, a test example of the present disclosure will be described.

The effect obtained when the via hole is filled with the Co film by performing the sequence of "film formation→etching→film formation" of the present disclosure was examined.

Here, a sample (sample 1) in which Co film formation was repeated twice on a via hole of φ160 nm was compared with a sample (sample 2) in which a sequence of "Co film formation→etching→Co film formation" was performed on a via hole of φ160 nm. The Co film formation was performed by using cobaltamidinate as a precursor at 240° C. The etching was performed by using Hfac and NO gas at 240° C. The other conditions of the film formation and the etching were as follows.

Figure 10A:
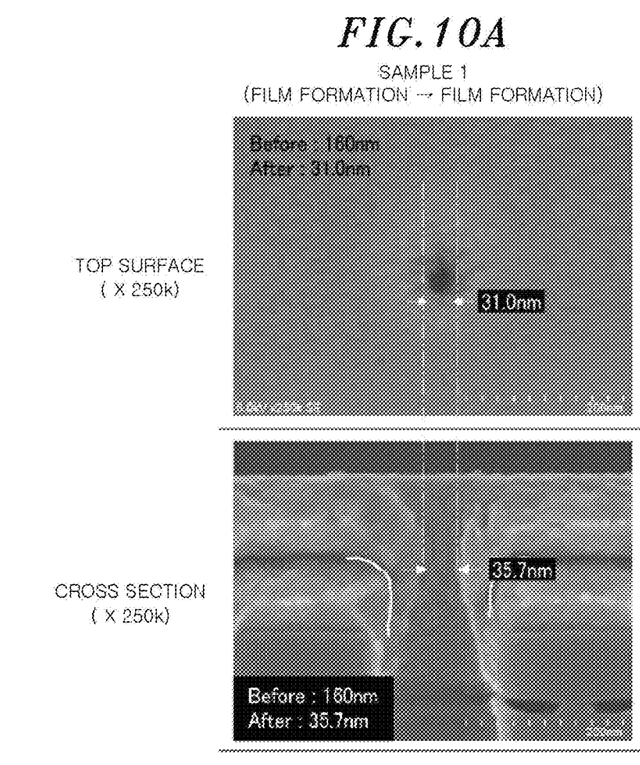
FIGS. 10A and 10B shows SEM images of cross sections and surfaces of a sample 1 in which Co film formation is repeated twice on a via hole of φ160 nm and a sample 2 in which a sequence of Co film formation, etching and Co film formation is performed on a via hole of φ160 nm.
Figure 10B:
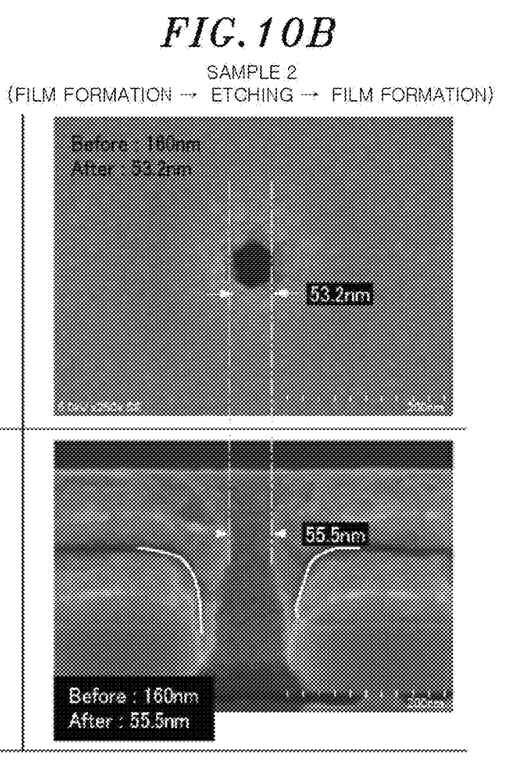

(Film Formation)
Pressure: 5 to 20 Torr
Reduction gas: $NH_3$ (50 to 500 sccm)
(Etching)
Pressure: 5 to 100 Torr FIGS. 10A and 10B show SEM images of surfaces and cross sections of the samples 1 and 2. As shown in FIG. 10A, in the sample 1 in which the Co film formation was repeated twice without etching, a large overhang was formed at the opening of the via hole and the diameter of the via hole was reduced from φ160 nm to φ31.0 nm at the narrowest portion. On the other hand, in the sample 2 in which the sequence of "film formation→etching→film formation" of the present disclosure was performed, as shown in FIG. 10B, the diameter of the via hole was φ53.2 nm at the narrowest portion and the overhang at the opening of the via hole was reduced by 22.2 nm by using both of Hfac and NO gas as the etching gas.

(Other Applications)

While the embodiments of the present disclosure have been described, the present disclosure is not limited to the above embodiments and may be variously modified within the scope thereof.

For example, the film forming system described in the above embodiment is merely an example. The film forming method of the present disclosure may also be implemented by other systems of various configurations.

Although the case of using the semiconductor wafer as the target substrate has been described, the target substrate is not limited to the semiconductor wafer and may be another substrate such as an FPD (Flat Panel Display) substrate represented by a substrate for LCD (Liquid Crystal Display), a ceramic substrate or the like.

In the above embodiments, the example in which the present disclosure is applied to the filling of the via hole has been described. However, the present disclosure may also be applied to filling of another recess.

While the disclosure has been shown and described with respect to the embodiments, it will be understood by those skilled in the art that various changes and modifications may be made without departing from the scope of the disclosure as defined in the following claims.

What is claimed is:

1. A film forming method for forming a cobalt film on a target substrate having a recess formed in a surface thereof to fill the recess with the cobalt film, the method comprising:
   a first step of partially filing the recess by forming a cobalt film on the target substrate by an ALD method or a CVD method using an organic metal compound gas;
   a second step of partially etching the cobalt film by supplying an etching gas containing β-diketone gas and NO gas to the target substrate; and
   a third step of further filling the recess by forming a cobalt film on the target substrate by the ALD method or the CVD method using an organic metal compound gas.

2. The film forming method of claim 1, wherein the second step and the third step are repeated twice or more.

3. The film forming method of claim 1, wherein in the first step and the third step, the cobalt film is formed by using cobalt amidinate as the organic metal compound gas and using a reduction gas.

4. The film forming method of claim 3, wherein the first step and the third step are performed while heating the target substrate to a temperature of 300° C. or less.

5. The film forming method of claim 1, wherein in the second step, a compound in which an alkyl group containing a halogen atom is bonded to a carbonyl group in a molecule is used as the β-diketone.

6. The film forming method of claim 5, wherein the β-diketone contains hexafluoroacetylacetonate.

7. The film forming method of claim 1, wherein a flow rate ratio of a flow rate of the NO gas to a flow rate of the β-diketone gas is within a range from 0.02 to 0.5.

8. The film forming method of claim 7, wherein the flow rate ratio of the flow rate of the NO gas to the flow rate of the β-diketone gas is within a range from 0.12 to 0.5.

9. The film forming method of claim 1, wherein the second step is performed while heating the target substrate to a temperature of 200° C. to 250° C.

10. The film forming method of claim 9, wherein the second step is performed while heating the target substrate to a temperature of 220° C. to 240° C.

11. The film forming method of claim 1, wherein the first step and the third step are performed in a first chamber and the second step is performed in a second chamber different from the first chamber,
   wherein the first to the third step are performed in a vacuum state, and
   wherein the target substrate is transferred between the first chamber and the second chamber in a vacuum state.

12. The film forming method of claim 1, wherein the first to the third step are performed in a same chamber.

13. A film forming system for performing the film forming method described in claim 1, the system comprising:
   a film forming apparatus configured to perform the first step and the third step;
   an etching apparatus configured to perform the second step; and
   a vacuum transfer chamber connected to the film forming apparatus and the etching apparatus, the vacuum transfer chamber having a transfer unit configured to transfer a target substrate between the film forming apparatus and the etching apparatus.

14. A film forming system for performing the film forming method described in claim 1, the system comprising:
   a film forming and etching apparatus including a single chamber, a film forming gas supply unit configured to supply a film forming gas used in the film formation of the first step and the third step into the chamber, and an etching gas supply unit configured to supply the etching gas used in the etching of the second step into the chamber.

15. A storage medium storing a program which is executed on a computer to control a film forming system, wherein the program, when executed, controls the film forming system through the computer to perform the film forming method described in claim 1.

* * * * *